United States Patent [19]

O'Neill et al.

[11] Patent Number: 5,308,414

[45] Date of Patent: May 3, 1994

[54] METHOD AND APPARATUS FOR OPTICAL EMISSION END POINT DETECTION IN PLASMA ETCHING PROCESSES

[75] Inventors: James A. O'Neill, New City; Michael L. Passow, Pleasant Valley; Jyothi Singh, Hopewell Junction, all of N.Y.

[73] Assignee: International Business Machines Corporation, Armonk, N.Y.

[21] Appl. No.: 995,727

[22] Filed: Dec. 23, 1992

[51] Int. Cl.[5] ............................................. G01N 21/00
[52] U.S. Cl. .................................. 156/626; 156/627; 156/345; 204/192.33; 204/298.32
[58] Field of Search ...................... 156/626, 627, 345; 204/298.32, 298.03, 192.33

[56] References Cited

U.S. PATENT DOCUMENTS

| | | | |
|---|---|---|---|
| 4,289,188 | 9/1981 | Mizutani et al. | 156/626 |
| 4,430,151 | 2/1984 | Tsukada | 156/626 |
| 4,491,499 | 3/1984 | Jerde et al. | 156/626 |
| 4,657,620 | 4/1987 | Davis et al. | 156/345 |
| 5,045,149 | 9/1991 | Nulty | 156/627 |
| 5,160,402 | 11/1992 | Cheng | 156/627 |

FOREIGN PATENT DOCUMENTS

| | | | |
|---|---|---|---|
| 63830 | 5/1980 | Japan | 156/626 |
| 57-120674 | 7/1982 | Japan . | |
| 43521 | 3/1983 | Japan | 156/626 |
| 59-61036 | 4/1984 | Japan . | |
| 93943 | 4/1987 | Japan | 156/626 |
| 282435 | 12/1987 | Japan | 156/626 |
| 63-81929 | 4/1988 | Japan . | |
| 107026 | 5/1988 | Japan | 156/626 |
| 244847 | 10/1988 | Japan | 156/626 |
| 133322 | 5/1989 | Japan | 156/626 |

OTHER PUBLICATIONS

Khoury, "Real-Time Etch plasma monitor system", IBM Technical Disclosure Bulletin, vol. 25 No. 11A Apr. 1983.

*Primary Examiner*—Thi Dang
*Attorney, Agent, or Firm*—Harold Huberfeld

[57] ABSTRACT

An apparatus and method for determining the time at which a plasma etching process should be terminated. The process generates at least one etch product species and a continuum plasma emission. The apparatus monitors the optical emission intensity of the plasma in a narrow band centered about a predetermined spectral line and generates a first signal indicative of the spectral intensity of the etch product species. The apparatus further monitors the optical emission intensity of the plasma in a wide band and generates a second signal indicative of the spectral intensity of the continuum plasma emission. The apparatus further monitors the magnitudes of the first and second signals and generates a termination signal when the magnitudes diverge.

16 Claims, 4 Drawing Sheets

METHOD AND APPARATUS FOR OPTICAL EMISSION END POINT DETECTION IN PLASMA ETCHING PROCESSES

The present invention relates generally to the control of plasma etching operations and, more particularly, to a method and apparatus for determining the time at which a plasma etching process should be terminated.

BACKGROUND OF THE INVENTION

Determining the time at which an etching reaction should end is very important for process control in the fabrication of micro-electronic devices. In particular, in plasma etching processes, optical emission spectroscopy has often been used to detect the products formed by the etching reaction. This technique has been useful in oxide, nitride, and metal etching operations. Heretofor, however, when the amount of exposed material on a semiconductor wafer being etched falls to about one percent of the surface area of the wafer, optical emission spectroscopy ceases to provide sufficient detection sensitivity for detecting such products. In oxide etching processes which use halocarbon gases in the generation of the etching plasma, a carbon monoxide etch product is formed and is often used to detect the time at which the process should be terminated, more commonly referred to as the end point. However, as was the case above, when very small patterns are etched on a wafer, the background levels of carbon monoxide evolved from outgassing, etching of the resist material, etching of quartz fixtures in the chamber and desorption from surfaces in the etch chamber make end point detection very difficult. In a typical manufacturing process, an end point detection apparatus consists of a monochromator tuned to monitor the etch product emission by means of a photo detector. The photo detector signal is frequently delivered to a low-pass filter or an integrator to enhance the signal-to-noise ratio of the end point signal. While low-pass filtering has been shown to effectively limit the system band-pass to that required to pass the slowly varying end point signal, response time is often unacceptable. In addition, both RC low-pass filtering and signal integration techniques are adversely affected by the fact that such measurements are centered at a direct current level, which is the region of maximum 1/f noise. Thus, both of these techniques may be adversely affected by long term drifts in the plasma generation or the optical detection systems. The above problems have been addressed in several prior patents.

Japanese Patent No. 0081929 describes the use of two optical signals to improve end point detection sensitivity in an $SiO_2$ etching process. One optical signal is derived from a molecular CO etch product of the etching reaction which decreases at end point. The other optical signal is derived from the atomic He buffer gas in the plasma. The He atom signal increases at end point. This patent teaches that by comparing these signals throughout the course of the etching reaction, the end point signal is enhanced as the signals diverge.

Japanese Patent No. 59-61036 also describes the use of two optical signals to improve end point detection sensitivity. This patent describes the etching of Si in a $CCl_4$ plasma. Optical signals at 400 nm and 510 nm are taught to diverge at the end point of the etching process. This patent teaches that by computing the ratio of the signals throughout the course of the etch process, the end point signal amplitude is enhanced.

Japanese Patent No. 0120674 teaches the use of phase sensitive detection to improve end point detection sensitivity. This patent further teaches the comparison of two optical signals for signal-to-noise improvement purposes. Such noise improvement is accomplished in part by the use of an external chopper or modulator in the phase sensitive detection circuit.

U.S. Pat. No. 4,491,499 to Jerde, et al shows a method and apparatus for optical emission end point detection. The technique disclosed therein measures the optical emission intensity of the plasma in a narrow band centered about a predetermined spectral line, for example, of one reactant species, and also measures the intensity of the plasma in a wide band centered about that same predetermined spectral line indicative of a background emission signal. The background signal is developed to derive a correction factor to thereby gain a more accurate indication of the intensity of the narrow band signal.

Applicants have discovered that the continuum plasma emission contains valuable information which may be detected and utilized in the end point detection process, unlike the prior systems wherein the continuum plasma emission, if recognized at all, is used to develop a correction factor so that its effects may be minimized or eliminated. Unlike the discrete atomic or molecular emission lines used to detect plasma etching end point in the prior art, the continuum plasma emission is a broad band spectral signal which arises from processes such as the radiative recombination of electrons with ions, the radiative attachment of electrons with neutral species or from the acceleration of electrons. Such a signal occurs at ultraviolet, visible, and infrared wave lengths. It is observed as a continuum between discrete emission lines. Such a continuum signal is inherent in all discharges and is sensitive to the electron density, electron temperature, and other electrical properties of the plasma which may change at end point as the nature of the exposed film changes.

SUMMARY OF THE INVENTION

Accordingly, an apparatus and method is provided for determining the time at which a plasma etching process should be terminated. The process generates at least one etch product species and a continuum plasma emission. The apparatus includes means for monitoring the optical emission intensity of the plasma in a narrow band centered about a predetermined spectral line and generating a first signal indicative of the spectral intensity of the etch product species. Means are further provided for monitoring the optical emission intensity of the plasma in a wide band and generating a second signal indicative of the spectral intensity of the continuum plasma emission. Means are included for monitoring the magnitudes of the first and second signals and generating a termination signal when the magnitudes diverge thereby indicating when the plasma etching process should be terminated. In another embodiment of the present invention, means are provided only for monitoring the optical emission intensity of the plasma and generating a signal indicative of the spectral intensity of the continuum plasma emission. Further means are provided for monitoring this signal and generating a termination signal in response to a change in magnitude thereof.

Other advantages and novel features of the present invention will become apparent from the following detailed description of the invention when considered in conjunction with the accompanying drawings.

DESCRIPTION OF THE PREFERRED EMBODIMENTS

Figure 1:
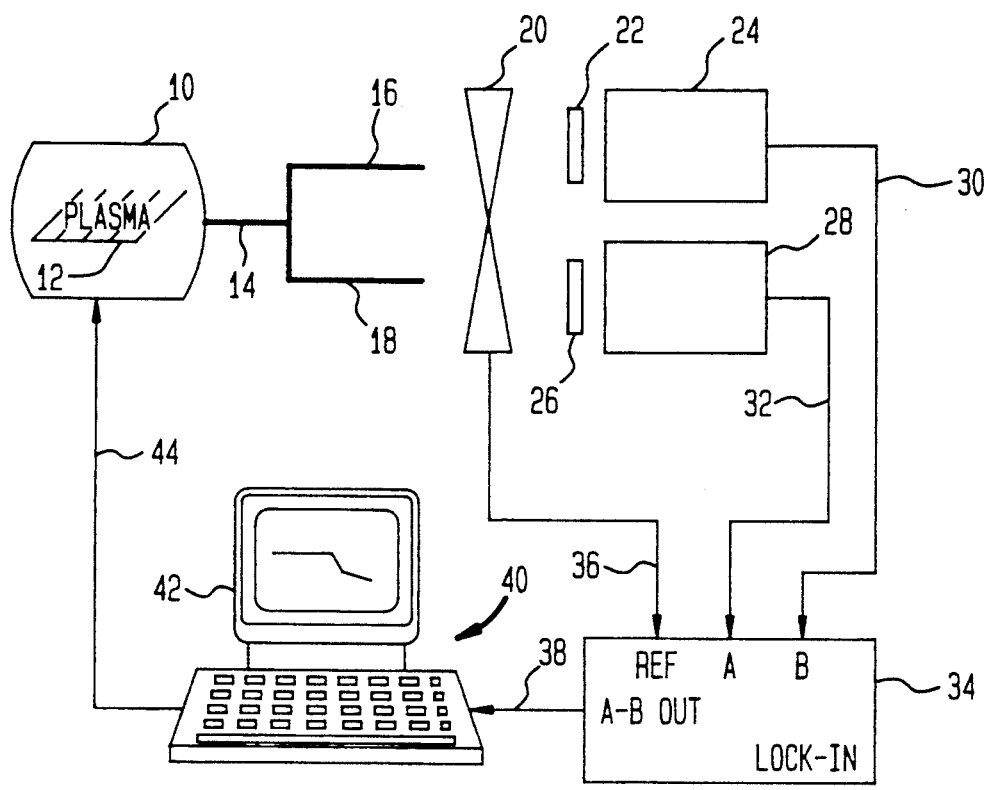
FIG. 1 shows a schematic diagram of a first embodiment of the apparatus of the present invention.

FIG. 1 shows a first embodiment of an apparatus of the present invention. An etch chamber 10 has a plasma 12 generated therein which contains at least one plasma species indicative of the progress of the etch reaction in the plasma etching process, typically an etch product species. The optical emission from the plasma 12 is collected by an optical fiber 14 which is bifurcated into a pair of optical paths 16 and 18. The optical emission signals from the fibers 16 and 18 are then frequency modulated, for example, by an optical chopper 20 at a frequency of approximately 500 Hz. The frequency modulated optical emission signal from the fiber 16 is then passed through a fixed or tunable narrow bandwidth optical filter 22 to an optoelectronic conversion device 24 which converts the filtered frequency modulated optical signal into a voltage variant electrical signal. The optical filter 22 is selected so as to be centered about a predetermined spectral line in the plasma 12 about which the spectral intensity of a known etch product species in the plasma 12 is generated. Typically, the width of the narrow band optical filter 22 is no more than two nm.

The frequency modulated optical emission signal from the fiber 18 is passed through a fixed or tunable wide band optical filter 26 to an optoelectronic conversion device 28, where a corresponding voltage variant signal is also produced. The optical filter 26 is centered about a predetermined wavelength anywhere along the continuum plasma emission and is of sufficiently wide bandwidth to deliver an optical emission signal to the device 28 having a relatively high signal-to-noise ratio, as will be discussed further in connection with FIG. 3. The optoelectronic conversion devices 24 and 28 may be of any known design but preferably are either photomultiplier tubes or photodiode detectors.

Thus a first monitoring path including optical fiber 14 and optical branch 16, frequency modulator 20, optical filter 22, and optoelectronic detector 24 serves to monitor the optical emission intensity of the plasma 12 in a narrow band centered about a predetermined spectral line and generate a first electrical signal on an output line 30 indicative of the spectral intensity of an etch product species within the plasma 12. Correspondingly, a second monitoring path including optical fiber 14, branch, 18, frequency modulator 20, optical filter 26, and optoelectronic conversion device 28 serve to monitor the optical emission intensity of the plasma in a wide band and generate a second electrical signal on line 32 indicative of the spectral intensity of the continuum emission from plasma 12.

These signals 30 and 32 are delivered to a lock-in amplifier 34 operated in a differential amplification mode to thereby amplify any change in the relative magnitudes between the signals on lines 30 and 32. The frequency modulator 20 delivers a signal on line 36 to amplifier 34 which is indicative of the modulation frequency.

Figure 2:
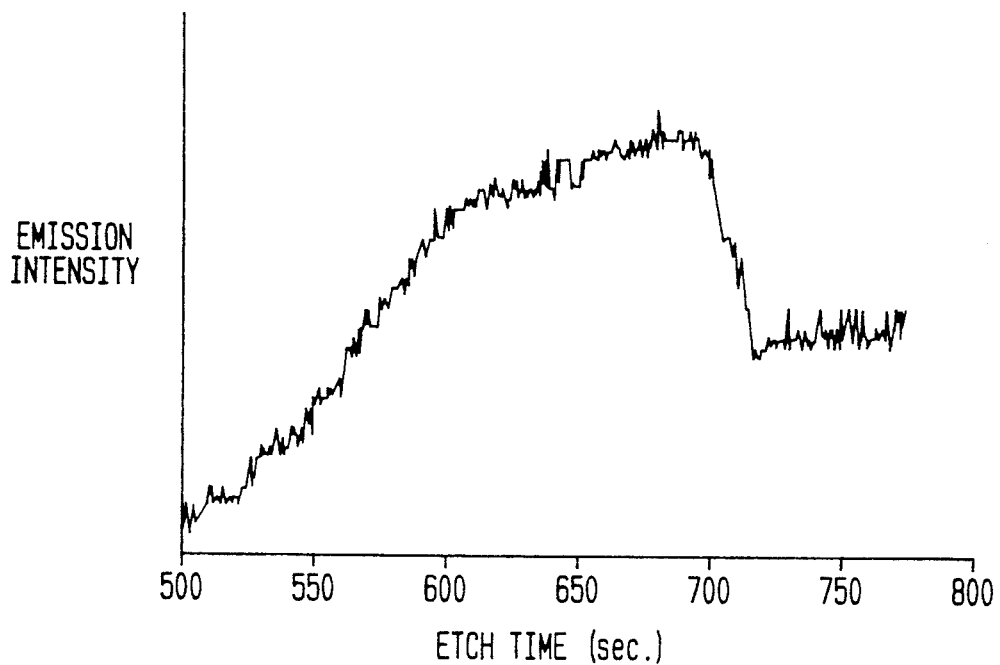
FIG. 2 shows a graph of optical emission intensity versus time for an example of the resultant signal produced by the apparatus of the present invention.

The signal on line 36 is used to demodulate the amplified differential between the signals on lines 32 and 30. The demodulated signal from amplifier 34 is delivered along line 38 to a suitable microprocessor control device such as a personal computer 40. The personal computer 40 may be utilized to produce a real-time visual display on its monitor of the signal received along line 38. Such a signal trace is shown graphically as a plot of emission intensity versus etch time in FIG. 2. The example shown in FIG. 2 is for the etching of $SiO_2$ on Si, having an exposed area of 0.82 percent. Additionally, the computer 40 can be utilized to generate a termination signal along line 44 to the etch chamber 10 to terminate the etching process. Thus, the lock-in amplifier 34, the signal line 38, and the computer 40 serve to monitor the magnitudes of the signals on lines 32 and 30 and generate a termination signal when the magnitudes diverge, thereby indicating when the plasma etching process should be terminated.

An alternative method of treating the signals 30 and 32 involves frequency demodulating the signals and taking a ratio of the two signals, for example, dividing the signal 30 by the signal 32 and delivering the output to computer 40. Such a ratioing technique may be accomplished with commercially available electronic circuits or software techniques.

In the method of the present invention in the differential amplifier mode, to initiate the process of the present invention, the input signals 30 and 32 are offset to achieve a null output from the lock-in amplifier 34. At this point the amplifier 34 gain is maximized, and end point is detected when the amplifier output changes significantly. By monitoring the difference between the two diverging optical emission signals 30 and 32, end point detection sensitivity is enhanced over that obtained by monitoring the change in only a single emission signal. If the system is to operate in the ratio mode, as discussed above, the signals 30 and 32 are offset to yield an amplitude ratio of unity. As the signals diverge at end point, the ratio falls as the continuum emission signal 32 increases due to changes in the plasma impedance. By monitoring the ratio of emission signals 30 and 32, the end point detection sensitivity is enhanced to a greater extent than is possible through the aforementioned differential detection techniques.

Figure 3:
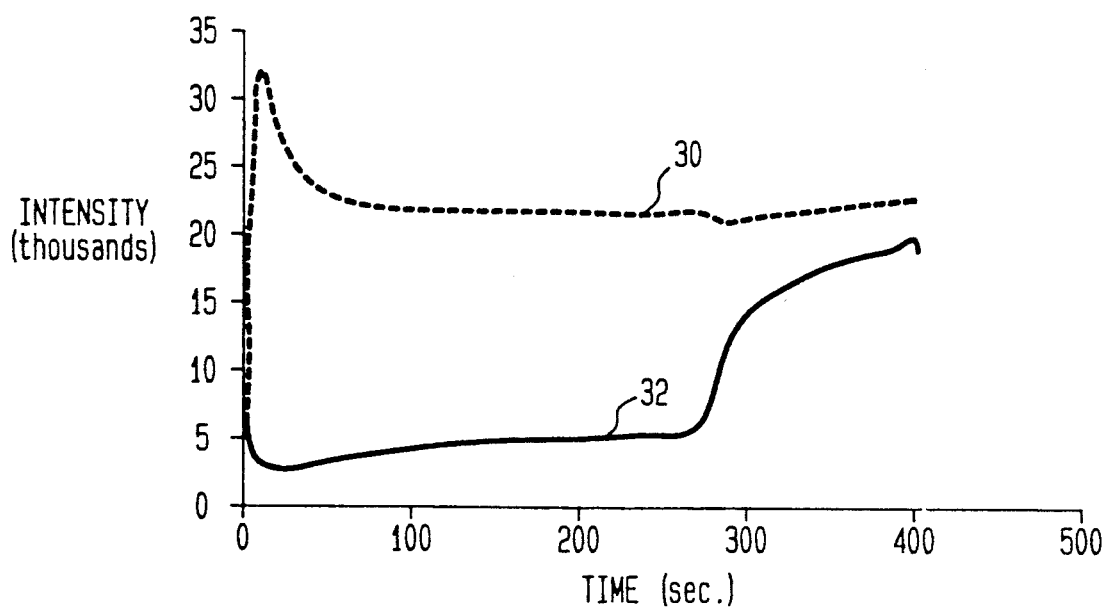
FIG. 3 shows a graph of optical emission intensity versus time for an example of two recorded signals using the apparatus of the present invention.

FIG. 3 shows a graph of emission intensity versus time for etching silicon dioxide to metal wherein the signal 30 is representative of a CO species monitored about a spectral line of 483.5 nm and wherein the continuum signal 32 is centered about a predetermined wavelength of 573.5 nm. As can be seen, the divergence of the two signals takes place at approximately 280 seconds into the process.

Figure 4:
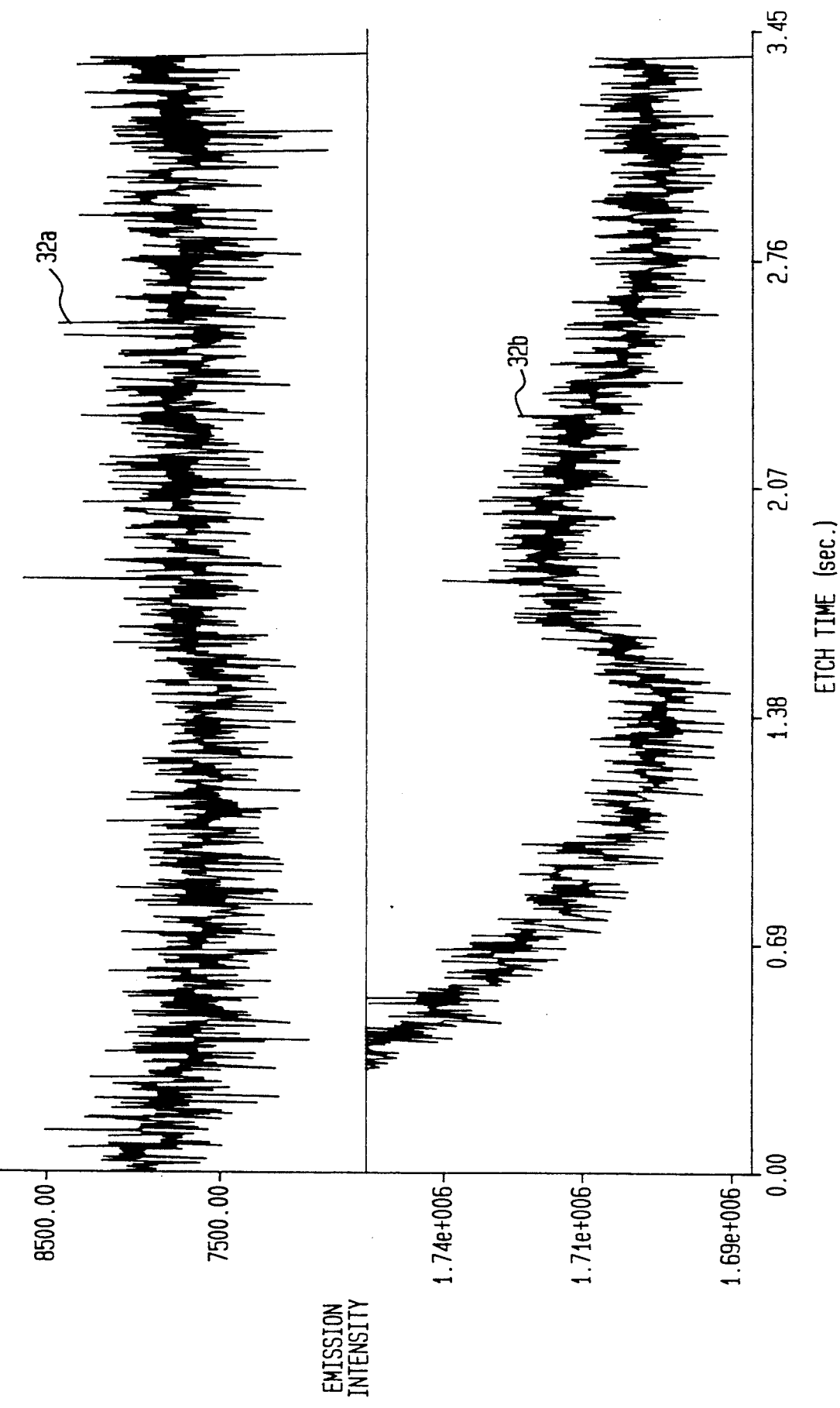
FIG. 4 shows a graph of an example of the spectral intensity of a continuum plasma emission signal versus time recorded over two wave length bandwidths.

FIG. 4 shows a graph of emission intensity versus time for two continuum emission signals 32a and 32b.

Figure 5:
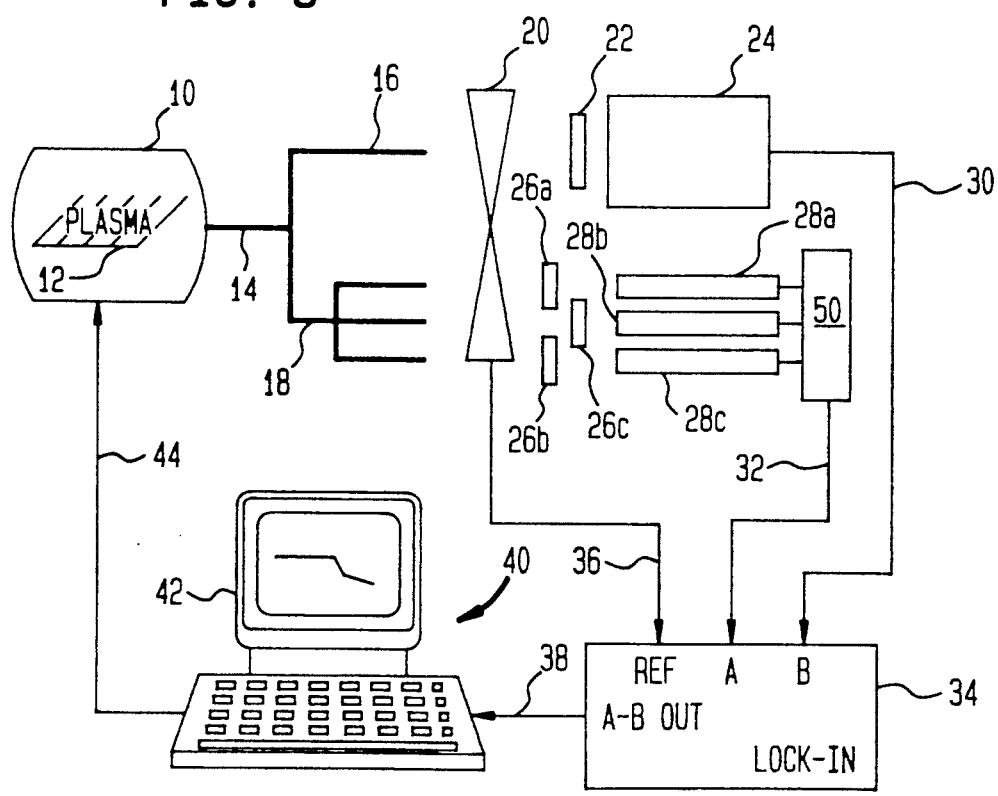
FIG. 5 shows a schematic diagram of a second embodiment of the apparatus of the present invention.

Both signals are recorded as centered about a spectral line of 290 nm using a low resolution spectrometer. The signal 32a was recorded over a bandwidth of only 5 nm. The signal 32b was recorded over a wavelength bandwidth of 100 nm. As can be seen from these two signals, the increase in width of the spectral bandwidth yields a significant improvement in signal-to-noise ratio. It is preferred that the spectral bandwidth of the continuum emission signal 32 be at least five times the full width at half maximum intensity of any single atomic emission line from a plasma etch product present in the chamber 10. Furthermore, the continuum signal may be a summation of a plurality of sensed region. Thus, as is shown in FIG. 5, the signal on line 18 may be further divided into a plurality of paths and passed through filters 26a, 26b and 26c. The sum of the bandwidths of the filters 26a, 26b and 26c equals the above-preferred band requirements. The outputs of the filters 26a, 26b and 26c are fed to optoelectronic conversion devices 28a, 28b and 28c, respectively and then summed in a summing circuit 50 to produce signal 32.

Figure 6:
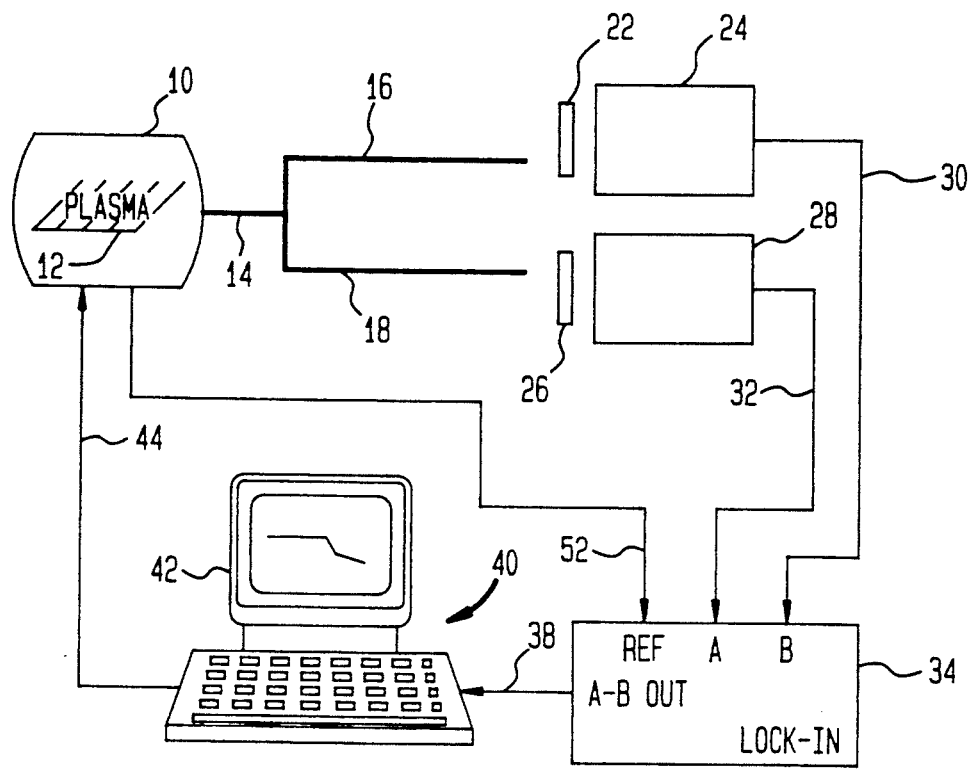
FIG. 6 shows a schematic diagram of a third embodiment of the apparatus of the present invention.

FIG. 6 shows a third embodiment of the apparatus of the present invention. In this embodiment the mechanical chopper 20 is replaced as a frequency modulator with a frequency modulation signal 52 inherent to the generator within the etch chamber 10 for generating plasma 12. For example, in a radio frequency (RF) etching system, the plasma intensity in the vicinity of the sheath varies periodically with the RF driving frequency as electrons oscillate with the time varying electric field. By replacing the signal 36 in the embodiment of FIG. 1 with a signal 52 as a demodulating signal thus referencing the lock-in amplifier 34 to the driving RF signal, phase sensitive detection of the desired emission wave length can be accomplished without the use of the mechanical chopper 20.

Another possible way of generating the signal 52 is through the detection of any periodic fluctuation in the intensity of plasma 12. For example, in certain etch chambers, the optical emission intensity is modulated by systematic changes in the magnetic confinement field. The period of modulation is typically approximately two seconds. In this embodiment a waveform associated with the time-varying current through the magnetic coils or the period of the optical emission signal on fiber 14 can be used as the reference signal 52 for the lock-in amplifier 34. Once again, this approach permits the phase-sensitive detection of the optical emission end point signals without the use of a mechanical chopper. This latter technique further provides a direct means of compensating for large fluctuations in the background emission signal received by fiber 14. Such periodic variations may otherwise make the detection of a small end point signal difficult to detect.

The theory behind the phase-sensitive technique used in the embodiments of the present invention is based on the fact that the end point signal varies relatively slowly with its main Fourier component at direct current where 1/f noise is greatest. The modulation of this end point signal places the amplitude information on a carrier wave form. This frequency is chosen to be well removed from 1/f noise and other environmental interferences. The modulated carrier wave is selectively amplified with a tuned amplifier whose measurement band-pass is optimized to reject noise components outside of the signal band pass. Thus an important aspect of the noise reduction process occurs when the amplified carrier wave form is synchronously demodulated through the use of a reference wave form such as the signal 36 in FIG. 1 or the signal 52 in FIG. 6. These techniques provide significant discrimination against random noise, since, an average, only the phase-lock carrier wave is demodulated in amplifier 34. The demodulated signal may be further filtered with high quality low-pass filters.

Figure 7:
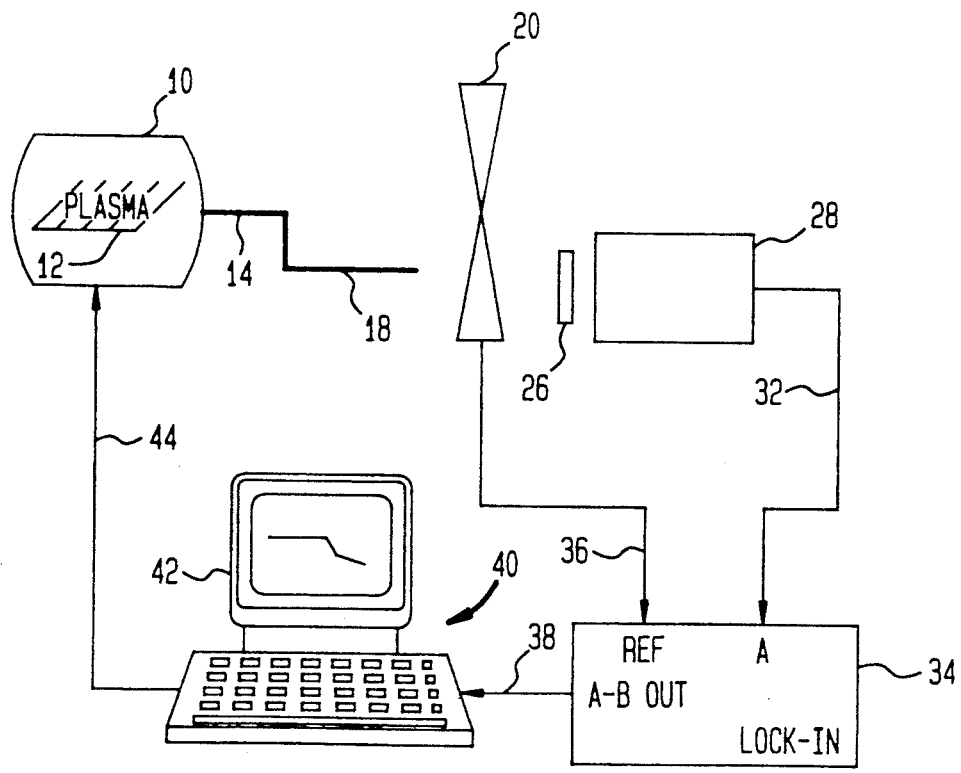
FIG. 7 shows a schematic diagram of a fourth embodiment of the apparatus of the present invention.

In some etch processes, no etch product species is produced which is strong enough to yield information useful to end point detection. In such processes, as is shown in FIG. 7, only the single optical fiber 14 is utilized along with chopper 20, filter 26, and optoelectronic converter 28 to produce signal 32. The signal 32 is delivered to the lock-in amplifier 34 where it is amplified, demodulated by means of reference signal 36 and delivered to computer 40 by line 38a. The magnitude of the signal on line 38a is then monitored for any change in magnitude to indicate the end point of the etch process.

Applicants have recognized that the continuum optical emission signal generated by the plasma in an etching process is particularly sensitive to changes in electron density and electron temperature, and provides a useful means for detecting changes in the material exposed on a wafer surface. Thus, the use of an optical signal derived from the continuum emission of an etching plasma is a particularly novel aspect of the method and apparatus of the present invention. It has the effect of improving end point detection system sensitivity and has several advantages over prior schemes which rely on the detection of discrete atomic or molecular optical emission lines.

First, continuum optical emission is a non-species specific phenomena which is detected in all regions of the spectrum. Atomic and molecular emission bands which are indicative of the course of the etching reaction occur in specific wave length regions which depend on the nature of the etch plasma.

Second, the continuum emission signal provides a generally applicable means of improving end point detection sensitivity over other techniques which rely exclusively on the detection of emission from the discrete species of the etch plasma.

Third, optical detection systems suitable for resolving discrete emission lines must be employed to detect light from atoms or molecules in the plasma. The detection of continuum emission can be accomplished with significantly simpler systems since high spectral resolution is not required. In fact, as shown in FIG. 4, end point detection sensitivity can actually be increased by increasing the width of the wavelength band being detected.

Finally, broad band continuum emission is sensitive to changes in electrical properties of the plasma which may change at end point as the nature of the wafer surface changes. Not all atomic or molecular species change at the end point of an etch reaction, and the emission from those which do change may be difficult to detect (i.e., either weak, obscured by other emission lines, or in a wave length region not being monitored).

While there have been described what are at present considered to be the preferred embodiments of the present invention, it will be obvious to those skilled in the art that various changes and modifications may be made therein, without departing from the invention, and it is, therefore, aimed in the appended claims to cover all such changes and modifications as follow in the true spirit and scope of the present invention.

What is claimed is:

1. An apparatus for determining the time at which a plasma etching process should be terminated, said process generating at least one discrete plasma species indicative of the progress of said process and a continuum plasma emission, comprising:

means for monitoring the optical emission intensity of said plasma in a narrow band centered about a predetermined spectral line and generating a first signal indicative of the spectral intensity of said plasma species;

means for monitoring the optical emission intensity of said plasma in a wide band distinct from said narrow band and the emission spectral line of any discrete plasma species and generating a second signal indicative of the spectral intensity of only said continuum plasma emission; and means for monitoring the magnitudes of said first and second signals and generating a termination signal when said magnitudes diverge, thereby indicating when said plasma etching process should be terminated.

2. The apparatus of claim 1 wherein said means for monitoring the magnitudes of said first and second signals includes optoelectronic conversion means for converting said first and second optical signals to corresponding first and second electrical signals.

3. The apparatus of claim 2 wherein the optical emission intensity of said plasma varies periodically and wherein said means for monitoring the magnitude of said first and second electrical signals includes a lock-in amplifier responsive to said periodic variations in the optical emission intensity of said plasma for synchronously demodulating said first and second electrical signals.

4. The apparatus of claim 1 wherein said means for generating a termination signal includes means for generating a signal equal to the ratio of said first and second signals.

5. The apparatus of claim 1 wherein said wide band is at least five time the full spectral bandwidth at half maximum intensity of the atomic emission line of said plasma species.

6. The apparatus if claim 5 wherein said means for monitoring the optical emission intensity of said plasma in a wide band includes generating a plurality of distinct wide band signals indicative of said continuum plasma emission and wherein said second signal is the sum of said plurality of distinct signals.

7. A method for determining the time at which a plasma etching process should be terminated, said process generating at least one discrete plasma species indicative of the progress of said process and a contniuum plasma emission, comprising:

monitoring the optical emission intensity of said plasma in a narrow band centered about a predetermined spectral line and generating a first signal indicative of the spectral intensity of said plasma species;

monitoring the optical emission intensity of said plasma in a wide band distinct from said narrow band and the emission spectral line of any discrete plasma species and generating a second signal indicative of the spectral intensity of only said continuum plasma emission;

monitoring the magnitudes of said first and second signals and generating a termination signal when said magnitudes diverge; and indicating when said plasma etching process should be terminated in response to said termination signal.

8. The method of claim 7 wherein said first and second signals are optical signals and further including the step of converting said first and second optical signals to first and second electrical signals.

9. The method of claim 8 wherein the optical emission intensity of said plasma varies periodically and further includes the steps of lock-in amplifying said first and second electrical signals; and synchronously demodulating said first and second electrical signals in response to said periodic variations in optical emission intensity of said plasma.

10. The method of claim 7 wherein generating said termination signal includes generating a signal equal to the ratio of said first and second signals.

11. The method of claim 7 wherein said wide band is at least five times the full spectral bandwidth at half maximum intensity of the atomic emission line of said plasma species.

12. The method of claim 11 wherein the step of monitoring the optical emission intensity of said plasma in a wide band includes generating a plurality of distinct wide band signals and summing said plurality of distinct signals to produce said second signal.

13. An apparatus for determining the time at which a plasma etching process should be terminated, said process generating at least one discrete plasma species and a continuum plasma emission, comprising:

means for monitoring the optical emission intensity of said plasma in a wide band distinct from the emission spectral line of any discrete plasma species and generating a signal indicative of the spectral intensity of only said continuum plasma emission; and means for monitoring said intensity signal and generating a termination signal when the magnitude of said signal changes a predetermined magnitude, thereby indicating when said plasma etching process shall be terminated.

14. An apparatus for determining the time at which a plasma etching process should be terminated, said process generating at least one plasma species indicative of the progress of said process comprising:

means for monitoring the optical emission intensity of said plasma in a narrow band centered about a predetermined spectral line and generating a first signal indicative of the spectral intensity of said plasma species;

means responsive to changes in an electrical property of said plasma for generating a second signal indicative thereof; and means for monitoring the magnitudes of said first and second signals and generating a termination signal when said magnitudes diverge, thereby indicating when said plasma etching process should be terminated.

15. The apparatus of claim 14 wherein said electrical property is the electron density of said plasma.

16. The apparatus of claim 14 wherein said electrical property is the electron temperature of said plasma.

* * * * *